(12) United States Patent
Hsin et al.

(10) Patent No.: US 9,978,875 B2
(45) Date of Patent: May 22, 2018

(54) THIN FILM TRANSISTOR AND METHOD FOR MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Lungpao Hsin, Beijing (CN); Jingang Fang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days. days.

(21) Appl. No.: 15/321,056

(22) PCT Filed: Mar. 14, 2016

(86) PCT No.: PCT/CN2016/076232
§ 371 (c)(1),
(2) Date: Dec. 21, 2016

(87) PCT Pub. No.: WO2016/165511
PCT Pub. Date: Oct. 20, 2016

(65) Prior Publication Data
US 2017/0200830 A1    Jul. 13, 2017

(30) Foreign Application Priority Data
Apr. 16, 2015   (CN) .......................... 2015 1 0181258

(51) Int. Cl.
*H01L 21/00*    (2006.01)
*H01L 29/10*    (2006.01)
(Continued)

(52) U.S. Cl.
CPC .... *H01L 29/78618* (2013.01); *H01L 27/1225* (2013.01); *H01L 29/24* (2013.01);
(Continued)

(58) Field of Classification Search
CPC ............... H01L 29/78618; H01L 29/24; H01L 27/1225
(Continued)

(56) References Cited

U.S. PATENT DOCUMENTS 5,903,029 A     5/1999   Hayashida et al.
2010/0301343 A1*  12/2010  Qiu .................... H01L 29/7869
                                                            257/66
(Continued)

FOREIGN PATENT DOCUMENTS

CN        1534361 A       10/2004
CN        102084470 A      6/2011
(Continued)

OTHER PUBLICATIONS

International Search Report and Written Opinion for Application No. PCT/CN2016/076232, dated Jun. 22, 2016, 12 Pages.

*Primary Examiner* — Igwe U Anya
(74) *Attorney, Agent, or Firm* — Brooks Kushman P.C.

(57) ABSTRACT

The present disclosure provides a thin film transistor and a method for manufacturing the same, an array substrate and a display device. The method for manufacturing a TFT includes forming a source electrode and a drain electrode, forming a metal layer on the source and drain electrodes, and forming a metal oxynitride semiconductor layer on the metal layer or on the source and drain electrodes and the metal layer. The metal layer is capable of being oxidized by oxygen ions in the metal oxynitride semiconductor layer.

20 Claims, 2 Drawing Sheets

(51) Int. Cl.
*H01L 29/786* (2006.01)
*H01L 29/24* (2006.01)
*H01L 29/45* (2006.01)
*H01L 27/12* (2006.01)
*H01L 29/66* (2006.01)

(52) U.S. Cl.
CPC ........ *H01L 29/45* (2013.01); *H01L 29/66969* (2013.01); *H01L 29/7869* (2013.01)

(58) Field of Classification Search
USPC ............................................. 257/43; 438/104
See application file for complete search history.

(56) References Cited

U.S. PATENT DOCUMENTS

| | | | |
|---|---|---|---|
| 2011/0070691 A1 | 3/2011 | Ye | |
| 2011/0102700 A1 | 5/2011 | Okada et al. | |
| 2011/0263079 A1* | 10/2011 | Wang | ................ H01L 21/28506 438/149 |
| 2012/0292610 A1* | 11/2012 | Wang | ................ H01L 29/42384 257/43 |
| 2012/0313093 A1 | 12/2012 | Kim et al. | |
| 2013/0221343 A1* | 8/2013 | Son | ................... H01L 29/78618 257/43 |
| 2013/0306966 A1 | 11/2013 | Seen et al. | |
| 2014/0152936 A1* | 6/2014 | Kim | .................... H01L 29/7869 349/43 |
| 2014/0339536 A1 | 11/2014 | Ye et al. | |
| 2015/0280000 A1* | 10/2015 | Seon | ................... H01L 29/7869 257/43 |
| 2017/0005198 A1* | 1/2017 | Zhang | ................. H01L 29/786 |

FOREIGN PATENT DOCUMENTS

| | | |
|---|---|---|
| CN | 102117836 A | 7/2011 |
| CN | 102640294 A | 8/2012 |
| CN | 103403873 A | 11/2013 |
| CN | 103855194 A | 6/2014 |
| CN | 104795449 A | 7/2015 |
| EP | 2738815 A1 | 6/2014 |

* cited by examiner

THIN FILM TRANSISTOR AND METHOD FOR MANUFACTURING THE SAME, ARRAY SUBSTRATE AND DISPLAY DEVICE

CROSS-REFERENCE TO RELATED APPLICATION APPLICATIONS

This application is the U.S. national phase of PCT Application No. PCT/CN2016/076232 filed on Mar. 14, 2016, which claims priority to Chinese Patent Application No. 201510181258.0 filed on Apr. 16, 2015, the disclosures of which are incorporated in their entirety by reference herein.

TECHNICAL FIELD

The present disclosure relates to the field of display technology, and in particular to a thin film transistor and a method for manufacturing the same, an array substrate and a display device.

BACKGROUND

Different structures of Oxide Thin Film Transistors (TFTs) have different properties. The electrical properties of the different structures need to be adjusted in a process design. There may be various complicated reaction mechanisms (e.g., electron transfer rate, ohm contact) between heterogeneous interfaces of the different structures. Therefore, the factors, such as process environment, plasma treatment, pollution treatment and light-shielding for an oxide semiconductor under illumination, become very important.

Zinc oxynitride (ZnON) TFT is preferred in the research and development due to a higher electron transfer rate and a lower price thereof. Compared with other oxide materials such as Indium Gallium Zinc Oxide (IGZO) material, the ZnON TFT generally has a bottom-gate structure.

Although the ZnON TFT is preferred in the research and development, a subthreshold swing (SS) performance of a TFT element is poor since the adding of nitrogen is an aporia in a ZnO type semiconductor material development and the ohm contact may become poor due to a drain of nitrogen.

There is not an effective solution in the related art to solve the above issue.

SUMMARY

An object of the present disclosure is to provide a TFT structure, so as to form a good ohm contact to prevent a degradation of the SS performance.

To achieve the above object, a thin film transistor and a method for manufacturing the same, an array substrate and a display device are provided in the present disclosure.

In one aspect, a TFT is provided, including a source electrode, a drain electrode, a metal oxynitride semiconductor layer arranged on the source and drain electrodes and a metal layer arranged between the source electrode and the metal oxynitride semiconductor layer and between the drain electrode and the metal oxynitride semiconductor layer. The metal layer is capable of being oxidized by oxygen ions in the metal oxynitride semiconductor layer.

Optionally, the metal layer covers the source and drain electrodes.

Optionally, the metal layer is provided with an aperture at a position corresponding to a gap between the source and drain electrodes, and a length of the aperture is smaller than or equal to a length of the gap between the source and drain electrodes.

Optionally, the metal layer further covers a part of a channel of the TFT between the source and drain electrodes.

Optionally, a material of the metal layer includes titanium.

Optionally, a material of the metal oxynitride semiconductor layer includes zinc oxynitride.

Optionally, a material of the source and drain electrodes includes copper.

In another aspect, an array substrate is further provided, including the TFT hereinabove.

In yet another aspect, a display device is further provided, including the array substrate hereinabove.

In still yet another aspect, a method for manufacturing a TFT is provided, including forming a source electrode and a drain electrode; forming a metal layer on the source and drain electrodes; and forming a metal oxynitride semiconductor layer on the metal layer or on the source and drain electrodes and the metal layer. The metal layer is capable of being oxidized by oxygen ions in the metal oxynitride semiconductor layer.

Optionally, in the step of forming the metal layer, the metal layer covers the source and drain electrodes and is provided with an aperture at a position corresponding to a gap between the source and drain electrodes, and a length of the aperture is smaller than or equal to a length of the gap between the source and drain electrodes.

According to the thin film transistor and the method for manufacturing the same, the array substrate and the display device, the titanium metal layer is cooperated with the ZnON semiconductor layer, such that the titanium may seize oxygen from the ZnON so as to form a ZnN with a higher conductivity. In addition, the titanium metal layer may become an effective blocking layer for the copper source and drain electrodes, so as to prevent the cupric ions from diffusing to the semiconductor layer, thereby forming a good ohm contact and then avoiding a degradation of the SS performance of the TFT.

DRAWING REFERENCES

1—gate electrode; 2—gate insulating layer; 3—source electrode; 4—drain electrode; 5—metal oxynitride semiconductor layer; 6—metal layer; 7—insulating layer

DETAILED DESCRIPTION

The present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
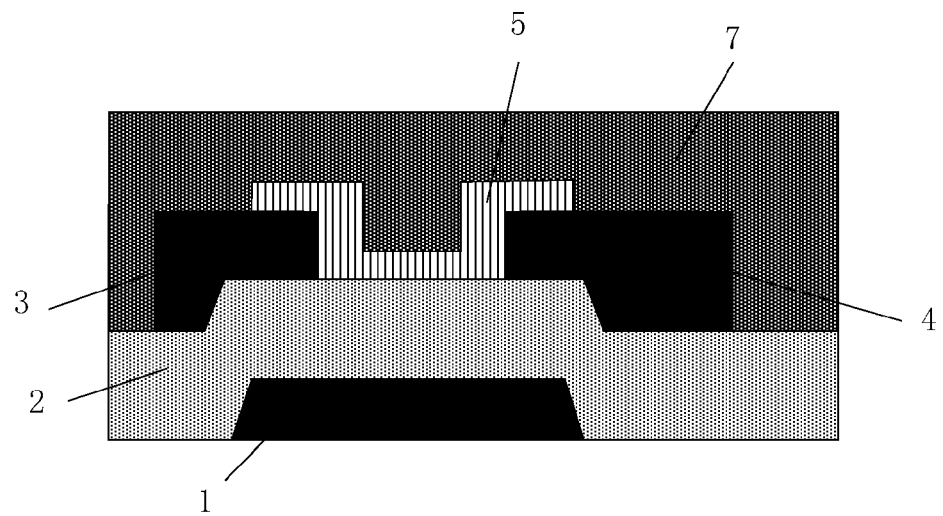
FIG. 1 is a schematic view of a coplanar type IGZO TFT.

It is common to apply IGZO as the semiconductor material of the TFT in the related art. For example, the common IGZO TFT includes a coplanar type IGZO TFT, a Back Channel Etched (BCE) type IGZO TFT and an Etch Stopped (ES) type IGZO TFT, and these IGZO TFTs have their respective advantage and disadvantage. Description will be given below by taking the coplanar type IGZO TFT as an example. For convenience of understanding, FIG. 1 may be refereed. FIG. 1 is a schematic view of a coplanar type IGZO TFT. In the IGZO TFT shown in FIG. 1, an IGZO is directly formed on the source and drain electrodes, therefore fewer masks are needed and a manufacturing process is simpler, but a front channel may be broken and an Oxide/SD contact may occur.

Compared with the Oxide TFT applying the IGZO or other semiconductor materials, the ZnON TFT has the advantages such as a higher electron transfer rate and a lower price, and the structure thereof is as that of the Oxide TFT hereinabove (e.g., the structure of the Oxide TFT shown in FIG. 1). However, the adding of nitrogen is an aporia in the ZnO type semiconductor material development, and the added nitrogen may drain easily, then the SS performance of a TFT element may be poor and the ohm contact thereof may be poor as a result. Moreover, an off-current of the ZnON TFT may be increased due to the illumination, and then a leak current may occur as a result.

In view of this, a solution which may solve the above issue is provided in the present disclosure. A TFT structure in the embodiments of the present disclosure is improved in compared with the TFT structure shown in FIG. 1. The TFT in the embodiments of the present disclosure employs the ZnON semiconductor material, and is able to avoid the drain of nitrogen and prevent the cupric ions of the source and drain electrodes from diffusing to the semiconductor material layer.

Figure 2:
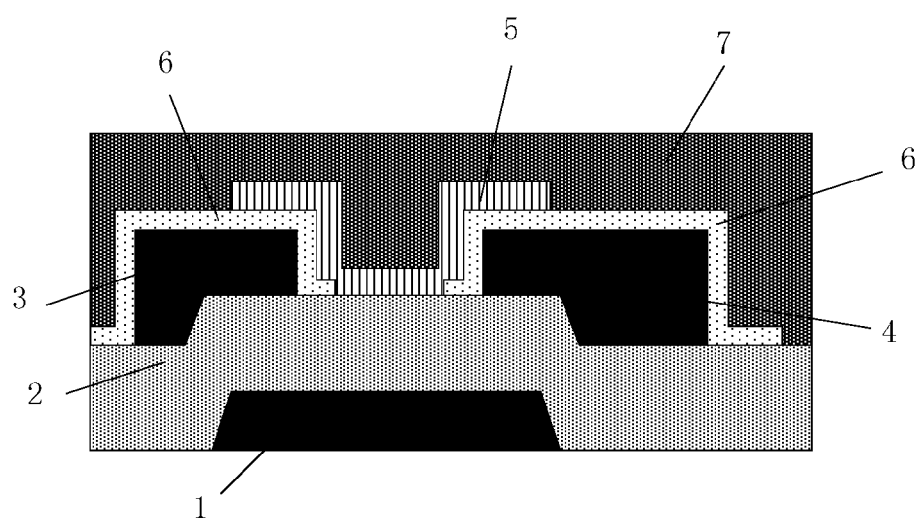
FIG. 2 is a schematic view of a TFT in some embodiments of the present disclosure.

The present disclosure provides a TFT in some embodiments thereof. FIG. 2 is a schematic view of a TFT in some embodiments of the present disclosure. As shown in FIG. 2, the TFT includes a source electrode, a drain electrode, a metal oxynitride semiconductor layer arranged on the source and drain electrodes and a metal layer arranged between the source electrode and the metal oxynitride semiconductor layer and between the drain electrode and the metal oxynitride semiconductor layer. The metal layer is capable of being oxidized by oxygen ions in the metal oxynitride semiconductor layer.

It can be seen from FIGS. 1 and 2, the TFT structure shown in FIG. 2 is different from that shown in FIG. 1, a semiconductor layer is not arranged directly on the source and drain electrodes, instead a metal layer is arranged thereon firstly. The metal layer has a good metal activity, so it may be combined with a metal oxynitride semiconductor layer arranged thereon and then reacted with the same. Specifically, metal atoms in the metal layer can be oxidized by oxygen ions in the metal oxynitride semiconductor layer. In other words, the metal layer may absorb the oxygen, such that the metal oxynitride may become a metal nitride having a better conductivity, and the entire semiconductor layer may have a high electronic mobility. And finally a good ohm contact is formed between the semiconductor layer and the source and drain electrodes.

In some embodiments of the present disclosure, the metal layer may cover completely the source and drain electrodes, such that a contact area of the metal layer and the source and drain electrodes may be enlarged and the ohm contact between the semiconductor layer and the source and drain electrodes may be improved effectively.

The metal layer is provided with an aperture at a position corresponding to a gap between the source and drain electrodes, and a length of the aperture is smaller than or equal to a length of the gap between the source and drain electrodes. That is, the metal layer does not cover completely the gap between the source and drain electrodes (i.e., a channel region), so as to avoid a short there between.

Of course, the length of the aperture can be designed according to practical requirements. For example, the length of the aperture is smaller than the length of the gap between the source and drain electrodes. That is, as shown in FIG. 2, the metal layer covers completely the source and drain electrodes and further covers a part of the channel region.

Optionally, in some embodiments, a material of the metal layer includes titanium. Of course, the material of the metal layer may further include metals having a similar property with titanium and be a good barrier for the metal material of the source and drain electrodes. Actually, in an actual manufacturing process and design, the metal material of the metal layer may be determined based on the metal material of the source and drain electrodes.

In some embodiments of the present disclosure, a material of the metal oxynitride semiconductor layer includes zinc oxynitride. In other words, the material of the metal oxynitride semiconductor layer in the TFT in some embodiments of the present disclosure includes zinc oxynitride. Of course, other semiconductor with a similar property with zinc oxynitride.

In some embodiments of the present disclosure, a material of the source and drain electrodes includes copper. Compared with Al, the coplanar type IGZO TFT, which applies copper as the material of the source and drain electrodes, may have a better ohm contact. Therefore, copper is preferred as the material of the source and drain electrodes.

Based on the TFT hereinabove, an array substrate including the TFT hereinabove is further provided in some embodiments of the present disclosure. The improvement of the array substrate lies in the TFT hereinabove, and the TFT is described in specific, so the detailed description of the array substrate is omitted herein.

Furthermore, a display device including the TFT hereinabove is provided in some embodiments of the present disclosure, and the detailed description thereof is omitted too. In a practical application, the display device may be any product having a display function, such as a display panel, a television, a displayer, a digital photo frame, a mobile phone, a tablet computer.

Figure 3:
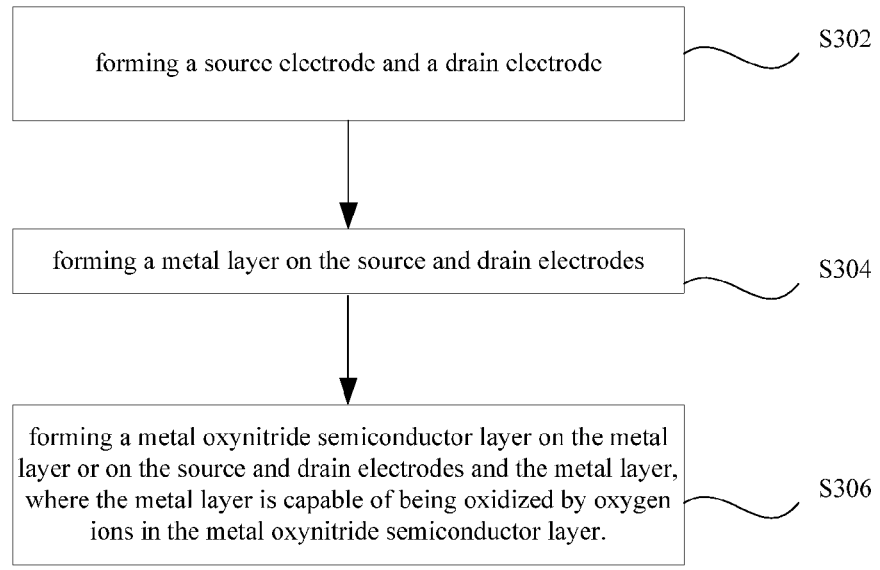
FIG. 3 is a flow chart of a method for manufacturing a TFT in some embodiments of the present disclosure.

Corresponding to the TFT hereinabove, a method for manufacturing a TFT is further provided in some embodiments of the present disclosure. FIG. 3 is a flow chart of a method for manufacturing a TFT in some embodiments of the present disclosure. As shown in FIG. 3, the method includes steps S302 to S306.

S302: forming a source electrode and a drain electrode;
S304: forming a metal layer on the source and drain electrodes; and
S306: forming a metal oxynitride semiconductor layer on the metal layer or on the source and drain electrodes and the metal layer, where the metal layer is capable of being oxidized by oxygen ions in the metal oxynitride semiconductor layer.

It should be noted that, when the metal layer covers completely the source and drain electrodes, the metal oxynitride semiconductor layer is formed on the metal layer; when the metal layer does not cover completely the source and drain electrodes, the metal oxynitride semiconductor layer is formed on the metal layer and the source and drain electrodes. That is, in Step 306, the metal oxynitride semiconductor layer is formed on the metal layer and a portion of the source and drain electrodes which is not covered by the metal layer.

According to the method hereinabove, in the process of forming the metal layer, the metal layer may cover completely the source and drain electrodes, and the metal layer is provided with an aperture at a position corresponding to a gap between the source and drain electrodes, and a length of the aperture is smaller than or equal to a length of the gap between the source and drain electrodes.

Next, the manufacturing process of the TFT hereinabove will be described in conjunction with FIG. 4.

Figure 4:
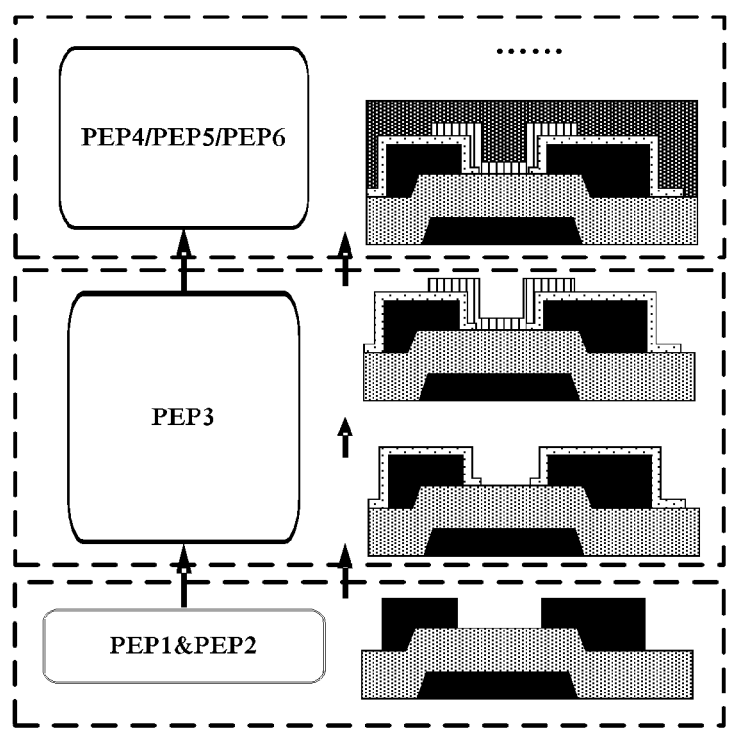
FIG. 4 is a schematic view of a manufacturing process of a TFT in some embodiments of the present disclosure.

FIG. 4 is a schematic view of a manufacturing process of a TFT in some embodiments of the present disclosure. As shown in FIG. 4, the manufacturing process of the TFT mainly includes the following steps.

(1) Photo etching process 1 (PEP 1) is performed to form a pattern of a gate metal layer. To be specific, a gate metal layer having a certain thickness (e.g., 2500-16000 Å) may be deposited on a base substrate by sputtering or evaporation. In a practical application, a material of the gate metal layer may include Cu, Al, Ag, Mo, Cr, Nd, Ni, Mn, Ti, Ta, W or an alloy thereof. The gate metal layer may be of a single layer structure or a multi-layer structure. The multi-layer structure, for example, may be Cu\Mo, Ti\Cu\Ti, Mo\Al\Mo or the like. Of course, as described hereinabove, in some embodiments of the present disclosure, a single layer structure of Cu may be applied, and then the pattern of the gate metal layer including gate lines and gate electrodes may be formed by PEP 1.

Then, a gate insulating layer is formed. To be specific, a gate insulating layer having a thickness of 1000-6000 Å may be deposited on the gate metal layer by chemical vapor deposition (CVD) or Plasma Enhanced Chemical Vapor Deposition (PECVD). A material of the gate insulating layer may include oxide, nitride or oxynitride. The gate insulating layer may be of a single layer structure, a double layer structure or a multi-layer structure. The material of the gate insulating layer may include $SiN_x$, $SiO_x$ or $Si(ON)_x$. For example, the gate insulating layer may be of a double layer structure including a layer of $SiN_x$ having a thickness of 500 Å and a layer of $SiO_2$ having a thickness of 1000 Å. Of course, the present disclosure is not limited herein.

(2) PEP 2 is performed to form a pattern of a source and drain metal layer including a source electrode, a drain electrode and a data line. A manufacturing process of the source and drain metal layer is similar to that of the gate metal layer. It should be noted that, in some embodiments of the present disclosure, a material of the source and drain metal layer may still include copper.

(3) PEP 3 is performed to form a Ti metal layer and a ZnON semiconductor layer. It should be noted that, this step is important in a manufacturing process of the TFT in the embodiments of the present disclosure. For a manufacturing process of the ZnON semiconductor layer, a concentration of the ZnON of the ZnON semiconductor layer may be controlled, so as to form a good contact interface between the Ti metal layer and the ZnON semiconductor layer, thereby a chemical reaction may occur therebetween to form the ZnN with an higher conductivity, and of course, that may be determined based on the actual requirements. Then, a TFT channel with a good conductivity is formed. The Ti metal layer may provide O-acceptors to absorb the oxygen (e.g. as of an ions state) in the ZnON. In addition, a combined layer formed by the Ti metal layer and the ZnON semiconductor layer is thin and well matched with the source and drain electrodes of the TFT, so the ohm contact between the semiconductor layer and the source and drain electrodes is good. Therefore, it is able to improve a TFT SS performance.

The materials of both the gate metal layers and the source and drain metal layer are copper, that is because the copper has better taper angle than Al and other materials and it is convenient for forming a good coplanar structure.

Ti is a good barrier for copper, which can prevent the copper ions from diffusing to the TFT channel. In addition, when the Ti metal is etched, the TFT channel may not be broken, therefore it is easy to achieve in a process development.

In addition, in the process, the ZnON as the oxygen donor may be formed by a high-temperature tempering in a development process of the oxide TFT, thereby forming an area having a good ohm contact. Of course, materials such as AlOx and TiOx may form a good compact insulating layer, thereby improving TFT stability significantly.

(4) Subsequent photo etching processes (PEP 4, PEP 5, and PEP 6) are performed to form an insulating layer (e.g., an organic insulating layer as a good light barrier), so as to prevent the front channel from being broken and being influenced by vapor from the external environment. Meanwhile, due to a color absorption effect of the organic insulating layer, an adverse influence of plasmas and a photoresist may be avoided, and then an adverse influence of light on the ZnO threshold voltage (Vth) may be reduced. The subsequent processes may refer to the related art, and the detailed description thereof is omitted herein.

By the structure hereinabove, the TFT channel may not be influenced no matter the light source is a top light source or a bottom light source. Therefore, the TFT may be applied to a LCD display screen and a display screen with an AMO-LED top-emitting element or bottom-emitting element. In addition, an aperture area of the OLED may be enlarged and a service life of the OLED may be increased since a size of the channel of the TFT may be reduced in some embodiments of the present disclosure. In addition, for the panel design, an adverse influence of a smaller unnecessary capacitor (e.g., acrobatics capacitor Cgd) may be omitted, thereby achieving a high-quality display.

In the above embodiments of the present disclosure, the gate electrode and the source and drain electrodes may be made of copper, thereby improving the ohm contact of the coplanar structure of the ZnON semiconductor. Meanwhile, a compact insulating layer is formed due to the structure formed by the Ti metal layer and the Oxide TFT, thereby forming a better ohm contact. In addition, such manufacturing process may be applied to a large-size TFT, thereby guaranteeing a high resolution, reducing a probability of a diffusion of copper to the TFT channel, and reducing an adverse influence of a back light on the TFT stability.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A thin film transistor (TFT), comprising:
   a source electrode;
   a drain electrode;
   a metal oxynitride semiconductor layer arranged on the source and drain electrodes; and
   a metal layer arranged between the source electrode and the metal oxynitride semiconductor layer and between the drain electrode and the metal oxynitride semiconductor layer;
   wherein the metal layer is capable of being oxidized by oxygen ions in the metal oxynitride semiconductor layer,
   the metal layer having an aperture at a position corresponding to a gap between the source and drain electrodes, the aperture being filled with the metal oxynitride semiconductor layer; and the metal oxynitride semiconductor layer being made of a metal that is different than that of the metal layer.

2. The TFT according to claim 1, wherein the metal layer covers the source and drain electrodes.

3. The TFT according to claim 2, wherein a length of the aperture is smaller than or equal to a length of the gap between the source and drain electrodes.

4. The TFT according to claim 3, wherein a material of the metal layer comprises titanium.

5. The TFT according to claim 3, wherein a material of the metal oxynitride semiconductor layer comprises zinc oxynitride (ZnON).

6. The TFT according to claim 3, wherein a material of the source and drain electrodes comprises copper.

7. The TFT according to claim 2, wherein the metal layer further covers a part of a channel of the TFT between the source and drain electrodes.

8. The TFT according to claim 7, wherein a material of the metal layer comprises titanium.

9. The TFT according to claim 7, wherein a material of the metal oxynitride semiconductor layer comprises zinc oxynitride (ZnON).

10. The TFT according to claim 7, wherein a material of the source and drain electrodes comprises copper.

11. The TFT according to claim 2, wherein a material of the metal layer comprises titanium.

12. The TFT according to claim 2, wherein a material of the metal oxynitride semiconductor layer comprises zinc oxynitride (ZnON).

13. The TFT according to claim 2, wherein a material of the source and drain electrodes comprises copper.

14. The TFT according to claim 1, wherein a material of the metal layer comprises titanium.

15. The TFT according to claim 1, wherein a material of the metal oxynitride semiconductor layer comprises zinc oxynitride (ZnON).

16. The TFT according to claim 1, wherein a material of the source and drain electrodes comprises copper.

17. An array substrate, comprising the thin film transistor according to claim 1.

18. A display device, comprising the array substrate according to claim 17.

19. A method for manufacturing a thin film transistor (TFT), comprising steps of:
   forming a source electrode and a drain electrode;
   forming a metal layer on the source and drain electrodes; and
   forming a metal oxynitride semiconductor layer on the metal layer or on the source and drain electrodes and the metal layer;
   wherein the metal layer is capable of being oxidized by oxygen ions in the metal oxynitride semiconductor layer,
   the metal layer having an aperture at a position corresponding to a gap between the source and drain electrodes, the aperture being filled with the metal oxynitride semiconductor layer; and the metal oxynitride semiconductor layer being made of a metal that is different than that of the metal layer.

20. The method according to claim 19, wherein in the step of forming the metal layer, the metal layer covers the source and drain electrodes, and a length of the aperture is smaller than or equal to a length of the gap between the source and drain electrodes.

* * * * *